United States Patent
Daniels et al.

(10) Patent No.: US 6,642,811 B2
(45) Date of Patent: Nov. 4, 2003

(54) BUILT-IN POWER SUPPLY FILTER FOR AN INTEGRATED CIRCUIT

(75) Inventors: Scott Leonard Daniels, Cedar Park, TX (US); Norman Karl James, Liberty Hill, TX (US); James Douglas Jordan, Round Rock, TX (US); Daniel Eugene Pridgeon, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/059,662

(22) Filed: Jan. 30, 2002

(65) Prior Publication Data

US 2003/0141944 A1 Jul. 31, 2003

(51) Int. Cl.[7] .................................................. H03H 7/01
(52) U.S. Cl. ........................................ 333/181; 333/185
(58) Field of Search .......................... 333/12, 181, 185, 333/246; 361/794

(56) References Cited

U.S. PATENT DOCUMENTS

| | | | |
|---|---|---|---|
| 4,266,091 A | 5/1981 | Fukuda | 174/72 B |
| 4,267,528 A * | 5/1981 | Thornberry | 333/12 |
| 4,440,972 A | 4/1984 | Taylor | 174/72 B |
| 5,068,631 A * | 11/1991 | Vince | 333/181 |
| 5,103,283 A * | 4/1992 | Hite | 257/724 |
| 5,220,298 A * | 6/1993 | Nagase | 333/185 |
| 5,272,600 A | 12/1993 | Carey | 361/792 |
| 5,410,263 A | 4/1995 | Waizman | 327/141 |
| 5,488,540 A * | 1/1996 | Hatta | 361/794 |
| 5,583,739 A | 12/1996 | Vu et al. | 361/313 |
| 6,016,084 A * | 1/2000 | Sugimoto | 333/12 |
| 6,037,846 A * | 3/2000 | Oberhammer | 333/182 |
| 6,043,724 A | 3/2000 | Frech et al. | 333/181 |
| 6,081,166 A | 6/2000 | Katakura | 331/57 |
| 6,091,310 A * | 7/2000 | Utsumi et al. | 333/12 |
| 6,215,372 B1 | 4/2001 | Novak | 333/12 |
| 6,222,260 B1 | 4/2001 | Liang et al. | 257/691 |
| 6,297,965 B1 * | 10/2001 | Sasaki et al. | 361/782 |
| 6,476,486 B1 * | 11/2002 | Humphrey et al. | 257/738 |

OTHER PUBLICATIONS

IBM Technical Disclosure Bulletin, "Integrated, Low Inductance, Small Area Capacitors for VLSI Semiconductor Packages", vol. 25, No. 2, Jul. 1982, pp. 883–888.

* cited by examiner

Primary Examiner—Seungsook Ham
(74) Attorney, Agent, or Firm—Duke W. Yee; Mark E. McBurney; Michael R. Nichols

(57) ABSTRACT

A power-supply filter that is built into an integrated circuit package is disclosed. An LC, RC, or RLC filter is built into the integrated circuit's chip carrier module and connected so as to filter the power supply entering the integrated circuit. By manufacturing the filter as part of the integrated circuit package, a chip manufacturer can eliminate the need for application-level developers to provide an external filtering network in the deployment of the integrated circuit in an application circuit.

17 Claims, 2 Drawing Sheets

BUILT-IN POWER SUPPLY FILTER FOR AN INTEGRATED CIRCUIT

BACKGROUND OF THE INVENTION

1. Field of the Invention

The present invention is directed generally toward integrated circuit technology. More specifically, the present invention is a power supply filter built into the chip carrier module of an integrated circuit.

2. Background of the Invention

Power supply noise is a fact of life in high-speed integrated circuit design. Particularly susceptible to such noise are high-frequency switching circuits, where load-induced switching noise may enter the power supply rails of the circuit, causing such problems as ground bounce.

Phase-locked loops (PLLs), in particular, are quite sensitive to this noise. For this reason, sensitive subcircuits such as a PLL often have their own dedicated power supply terminals that are separate from the power supply terminals of the other components. But although a PLL can be manufactured in an integrated circuit with dedicated power supply rails, it is not easily deployed in practice, since external filtering networks must be carefully designed to allow power supply noise from interfering with the operation of the PLL. This filter network design process is difficult and time-consuming. Thus ideally, an application-level developer would prefer not to have to design power supply filter networks to use with PLLs or other integrated circuits. It would be preferable, then, for the filter circuitry to be somehow incorporated into the integrated circuit package itself, so that an application-level developer need not be concerned with the design of the filter; it would simply be prefabricated for immediate use.

Ideally, this filter would be located on the integrated circuit itself to reduce the effects of parasitic inductance's and resistance's of connecting wires. This is not a practical solution, however, since at high frequencies, inductors are needed within the filter networks, and inductors are impractical to fabricate or simulate (e.g., with so-called "gyrator" circuits) in a silicon chip. Also, it should be noted that at low frequencies, although inductors are not necessary, relatively large capacitors are necessary, and these capacitors are not particularly practical to implement in an integrated circuit, either. Capacitors, in general, tend to take up a disproportionately large amount of space on an integrated circuit. Including a large number of capacitors on a integrated circuit may also cause leakage currents to be generated, which is also undesirable.

Thus, what is needed is an integrated circuit, and in particular a PLL integrated circuit, that eliminates the need for external power supply filtering in an application circuit.

SUMMARY OF THE INVENTION

The present invention provides a power-supply filter that is built into an integrated circuit package. An LC, RC, or RLC filter is built into the integrated circuit's chip carrier module and connected so as to filter the power supply entering the integrated circuit. By manufacturing the filter as part of the integrated circuit package, a chip manufacturer can eliminate the need for application-level developers to provide an external filtering network in the deployment of the integrated circuit in an application circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
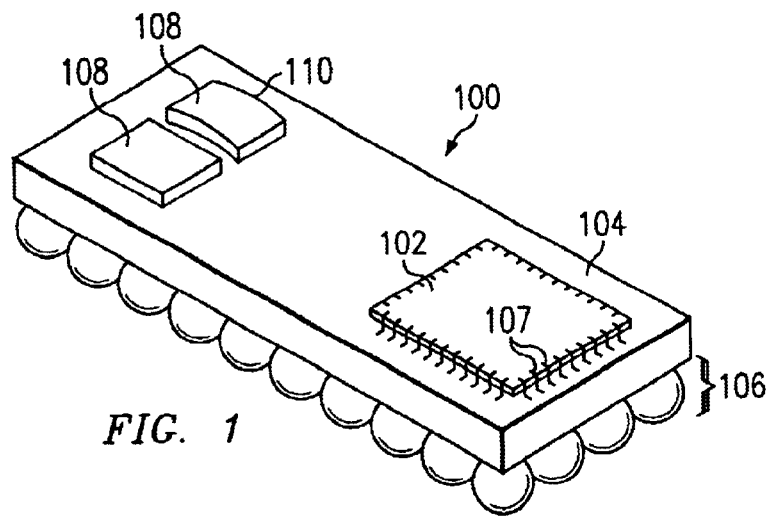
FIG. 1 is a diagram depicting the internals of an integrated circuit package in accordance with a preferred embodiment of the present invention.

FIG. 1 is a diagram depicting the internals of an integrated circuit package 100 in accordance with a referred embodiment of the present invention. Integrated circuit package 100 would normally include a top portion that would hermetically seal the contents of integrated circuit package 100, but the top portion has been removed in FIG. 1 so that the internal components of integrate circuit package 100 can be seen.

Integrated circuit package 100 contains a monolithic integrated circuit 102, which may be constructed of doped silicon (Si), gallium arsenide (GaAs), or any other suitable material. Integrated circuit 102 is mounted on a chip carrier substrate 104, which is preferably constructed of some type of electrical insulator, such as plastic or ceramic. Integrated circuit package 100 contains a number of electrical contacts 106, which allow integrated circuit package 100 to be used as a component in a larger circuit, manufactured, for instance, on a printed circuit board. Wires, such as wire 107, connect integrated circuit 102 to contacts 106. Other forms of connection between integrated circuit 102 and contacts 106 are possible, however, and the present invention does not require the use of any particular connection scheme. For instance, solder bumps placed below integrated circuit 102 may be used or a "bumpless" design such as that described in "Intel Technology Promises 20 GHz Chips," Computer, IEEE Computer Society, December 2001, pp. 25–27 may be used.

Contacts 106 are small balls of metal (such as solder balls) arranged in a grid. For this reason, integrated circuit package 100 is called a ball grid array (BGA). Many other different kinds of integrated circuit packages could be used in practice without departing from the scope and spirit of the present invention. Other integrated circuit package types include, but are by no means limited to, dual in line pin (DIP), single inline pin (SIP), pin grid array (PGA), plastic leadless chip carrier (PLCC), and the like. The choice of integrated circuit package type can have a significant effect on the frequency response of the complete integrated circuit package. For instance, each of contacts 106 has a particular level of inductance that must be taken into account in determining the frequency response of integrated circuit package 100 as a whole. Part of the motivation behind the present invention is to reduce the effects of these inductances on integrated circuit 102's power supply rails.

Also mounted on chip carrier substrate 104 are filter components 108. Filter components 108 make up a filter circuit for filtering the power supply of sensitive subcircuits of integrated circuit 102. Filter components 108 may include capacitors, inductors, resistors or any other circuit component suitable for inclusion within a filter. In a preferred embodiment, filter components 108 include a ceramic capacitor and one or more ferrite bead inductors. Filter components 108 are here depicted as surface components that are soldered to metal circuit traces 110 on substrate 104, filter components 108 may comprise conventional leaded circuit components or any other form of circuit components suitable for assembly on or in substrate 104.

Figure 2:
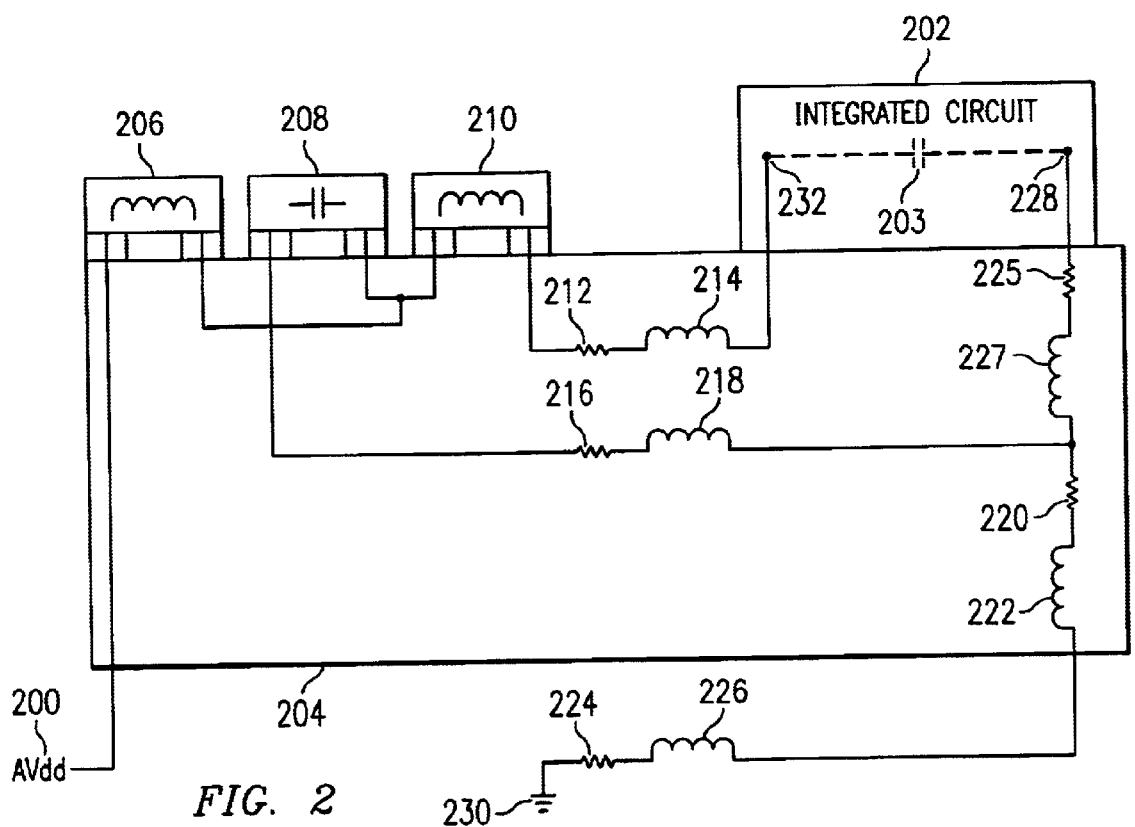
FIG. 2 is an electrical diagram depicting a preferred embodiment of the present invention.
Figure 4:
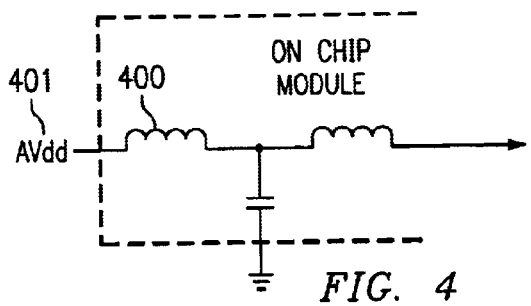
FIG. 4 depicts a filter where both inductors are located on the chip module in accordance with a preferred embodiment of the present invention.

FIG. 2 is an electrical diagram depicting a preferred embodiment of the present invention. Power supply line AVdd 200 provides power to at least a portion of integrated circuit 202, which is mounted on substrate 204. Ferrite bead 206, capacitor 208, and ferrite bead 210, surface mount components, are mounted to substrate 204 and connected in a standard low-pass T filter configuration, as depicted in FIG. 4. Ferrite bead 206, capacitor 208, and ferrite bead 210 filter the incoming power supply voltage AVdd 200 and supply power to AVdd connection 232 of integrated circuit 202.

As the components mounted on substrate 204 are all connected using wires or other conductors, parasitic effects of these conductors appear as parasitic components (212–227). In particular, parasitic resistance 224 and parasitic inductance 226 are a function of the contacts (e.g., contacts 106 in FIG. 1) used, whether they be pins, balls, vias, or other types of contacts, since circuit board ground 230 is connected to integrated circuit 202 through one or more metal contacts.

Capacitor 208 and ferrite bead 210 not only reduce noise from AVdd 200; they also reduce ground bounce (i.e., variation in the integrated circuit's ground that is not reflected in the overall circuit board ground) that may occur at circuit ground 228, which is the ground connection for integrated circuit 202. Without capacitor 208 and ferrite bead 210, ground bounce could occur at circuit ground 228 because of the effects of parasitic components 220, 222, 224, and 226. Since parasitic components 220, 222, 224, and 226 appear as a high impedance high-frequency signals, a high frequency voltage could be dropped across parasitic components 220, 222, 224, and 226, which would result in ground bounce at circuit ground 228.

Including capacitor 208 and ferrite bead 210 creates a loop containing capacitor 208, ferrite bead 210, parasitic components 212 and 214, integrated circuit 202 (which can be modeled as a capacitor 203), and parasitic components 216, 218, 225, and 227 in practice, the circuit components will be arranged so that parasitic components 216 and 218 appear as a lower impedance than parasitic components 220 and 222 (e.g., by keeping the conductor lengths in the loop short). High frequency noise at circuit ground 228 then has a low impedance path to follow through the loop, bypassing the path used by high transient currents resulting from I/O or core circuits in integrated circuit 102, namely the path to ground formed by parasitic components 220–224 and 226. The high-frequency noise is voltage-dropped across ferrite bead 210, which reduces or eliminates the ground bounce at circuit ground 228.

In practice, when a T-configuration filter such as is shown in FIG. 2 is used, the value of the capacitor and the inductor closest to the integrated circuit (e.g., capacitor 208 and ferrite bead 210) are more critical to filter operation than is the other inductor (e.g., ferrite bead 206). Hence, it is more important for these more critical components to be placed on the substrate (also called a module). Thus, some variation with respect to the locations of the filter components is possible. FIGS. 3–6 depict a number of possible variations on the basic T filter described in FIG. 2.

Figure 3:
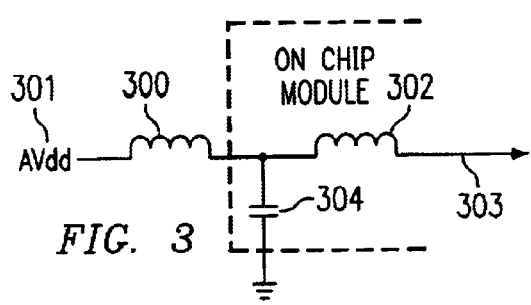
FIG. 3 depicts a T filter wherein one of the inductors is located on the circuit board, rather than on the chip module in accordance with a preferred embodiment of the present invention.

FIG. 3 depicts a T filter wherein inductor 300, which represents the arm of the "T" that is connected to the external power source AVdd 301, is located on the circuit board, rather than on the chip module (substrate). Capacitor 304 and inductor 302, which make up the trunk and second arm of the "T," are located on the chip module, with inductor 302 being connected to AVdd input 303 of the integrated circuit. FIG. 4 depicts the "T" filter described in FIG. 2, where inductor 400, which is connected to AVdd 401, is located on the module.

Figure 5:
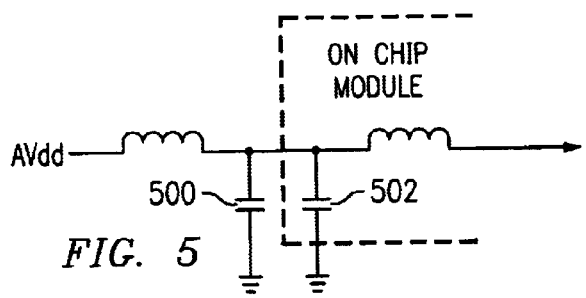
FIG. 5 depicts a filter having a second off-module capacitor in parallel with the on-module capacitor in accordance with a preferred embodiment of the present invention.

FIG. 5 depicts another variation on the basic T-filter in which two capacitors 500 and 502 are used. In some circumstances it may be desirable to have one capacitor (500) located on the circuit board in parallel with the capacitor on the chip module (502). For instance, ceramic capacitors are easily manufactured as surface-mount components and have a high "quality factor" (also known as "Q" to those skilled in the art).

Tantalum capacitors, on the other hand, have a low "Q," but can be too bulky to be placed on the chip module. When a low "Q" is desired, then, a tantalum capacitor, such as capacitor 500, can be wired in parallel with the ceramic capacitor (502) on the module.

Figure 6:
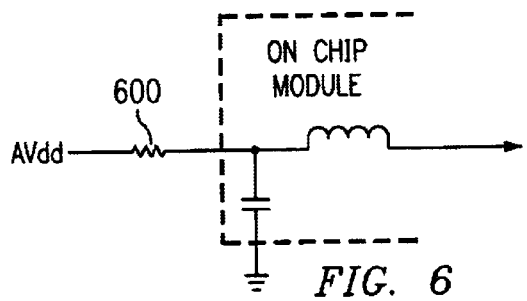
FIG. 6 depicts a T filter wherein one of the arms of the filter is an off-module resistor.

FIG. 6 depicts yet another variation on the basic T filter. A resistor 600 or other component (such as a linear regulator, for example) may be used in place of or in addition to the inductor (e.g., 300 in FIG. 3) that would normally be connected to the power supply.

Figure 7:
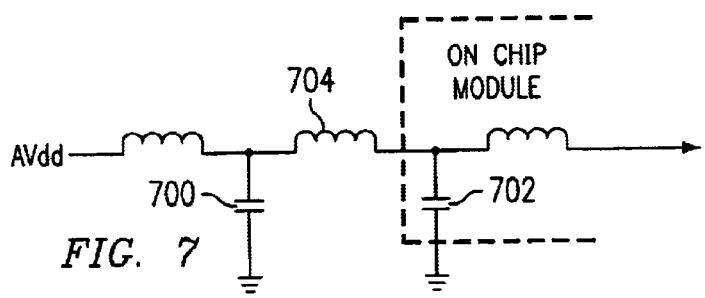
FIG. 7 depicts a variation on the filter in FIG. 5, wherein an additional inductor is connected between to the two capacitors.

FIG. 7 depicts an additional variation on the circuit in FIG. 5 in which an additional inductor 704, which is on the circuit board, rather than the module, is connected between on-board capacitor 700 and on-module capacitor 702.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An integrated circuit package comprising:

a first power supply terminal for receiving power for said package and an integrated circuit coupled to the package;

said integrated circuit being coupled to said integrated circuit package and having a second power supply terminal;

said integrated circuit package capable of being mounted to a printed circuit board;

a substrate;

said integrated circuit being mounted on said substrate;

a T-type filter for blocking noise from said first power supply terminal from entering said integrated circuit, and for reducing ground bounce at an integrated circuit ground terminal;

said filter having a filter input terminal for receiving said power and a filter output terminal, wherein the filter input terminal is connected to the first power supply terminal, the filter output terminal is connected to the second power supply terminal, the filter includes filter components, and the filter components are mounted to the substrate;

said filter including a first device, a second device, and a capacitor;

said first device having a first terminal and a second terminal, said second device having a first terminal and a second terminal, said capacitor having a first terminal and a ground terminal;

said first terminal of said first device being coupled to said first power supply terminal of said package, wherein said first terminal of said first device is said filter input terminal;

said second terminal of said first device being coupled to said first terminal of said capacitor and said first terminal of said second device;

said second terminal of said second device being coupled to said second power supply terminal of said integrated circuit, wherein said second terminal of said second device is said filter output terminal; and said integrated circuit having said integrated circuit ground terminal, said ground terminal of said capacitor being a filter ground terminal, the integrated circuit package having a package ground terminal, and the integrated circuit ground terminal, the filter ground terminal, and the package ground terminal being connected together.

2. The integrated circuit package of claim 1, further comprising:

said capacitor of said filter being located on said printed circuit board and external to the integrated circuit package.

3. The integrated circuit package of claim 2, wherein the capacitor is a tantalum capacitor.

4. The integrated circuit package of claim 1, further comprising:

said first device being an inductor being located on said printed circuit board and that is external to the integrated circuit package; and said capacitor of said filter being located on said printed circuit board and a external to the integrated circuit package.

5. The integrated circuit package of claim 4, further comprising:

an additional circuit component that is external to the integrated circuit package, the additional circuit component having a component terminal that is connected to the first terminal of said capacitor.

6. The integrated circuit package of claim 5, wherein the additional circuit component is an additional inductor.

7. The integrated circuit package of claim 1, further comprising:

an additional circuit component that is external to the integrated circuit package, the additional circuit component having a component terminal that is connected to the first power supply terminal.

8. The integrated circuit package of claim 7, wherein the additional circuit component is an inductor.

9. The integrated circuit package of claim 7, wherein the additional circuit component is a resistor.

10. The integrated circuit package of claim 7, wherein the additional circuit component is a linear regulator.

11. The integrated circuit package of claim 1, wherein the filter includes surface mount components.

12. The integrated circuit package of claim 1, wherein the filter includes a ferrite bead.

13. The circuit of claim 1, further comprising:

said first device, said second device, and said capacitor being mounted on said substrate within said package.

14. The circuit of claim 1, further comprising:

said first device being mounted on said printed circuit board.

15. The circuit of claim 1, further comprising:

a second capacitor including a first terminal coupled to said first terminal of said first device, and including a second capacitor ground terminal coupled to said package ground terminal, said integrated circuit ground terminal, and said filter ground terminal; a third device being inserted between said first power supply terminal and said first terminal of said first device, wherein a first terminal of said third device is coupled to said first power supply terminal and a second terminal of said third device is coupled to said first terminal of said first device; and said third device and said second capacitor being mounted on said printed circuit board.

16. The circuit of claim 1, further comprising:

said first device being an inductor; and said second device being an inductor.

17. An integrated circuit package comprising:

a first power supply terminal;

an integrated circuit being coupled to said integrated circuit package and having a second power supply terminal;

said integrated circuit package capable of being mounted to a printed circuit board;

a substrate;

said integrated circuit being mounted on said substrate;

a T-type filter for blocking noise from said first power supply terminal from entering said integrated circuit, and for reducing ground bounce at an integrated circuit ground terminal;

said filter having a filter input terminal and a filter output terminal, wherein the filter input terminal is connected to the first power supply terminal, the filter output terminal is connected to the second power sup ply terminal, the filter includes filter components, and the filter components are mounted to the substrate;

said filter including a first device mounted to the printed circuit board, a second device mounted to the substrate, and a capacitor mounted to the substrate;

said first device having a first terminal and a second terminal, said second device having a first terminal and a second terminal, said capacitor having a first terminal and a ground terminal;

said first terminal of said first device being coupled to said first power supply terminal of said package, wherein said first terminal of said first device is said filter input terminal;

said second terminal of said first device being coupled to said first terminal of said capacitor and said first terminal of said second device;

said second terminal of said second device being coupled to said second power supply terminal of said integrated circuit, wherein said second terminal of said second device is said filter output terminal;

said integrated circuit having said integrated circuit ground terminal, said ground terminal of said capacitor being a filter ground terminal, the integrated circuit package having a package ground terminal, and the integrated circuit ground terminal, the filter ground terminal, and the package ground terminal being connected together.

* * * * *